United States Patent
Havemann

(10) Patent No.: US 6,677,188 B1
(45) Date of Patent: Jan. 13, 2004

(54) METHODS FOR FORMING A FUSE IN A SEMICONDUCTOR DEVICE

(75) Inventor: Robert H. Havemann, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 10/188,528

(22) Filed: Jul. 3, 2002

(51) Int. Cl.[7] .............................................. H01L 21/82
(52) U.S. Cl. ...................................................... 438/132
(58) Field of Search ................. 438/132, 601, 438/281

(56) References Cited

U.S. PATENT DOCUMENTS 6,498,385 B1 * 12/2002 Daubenspeck et al. ..... 257/529

\* cited by examiner

Primary Examiner—Michael S. Lebentritt
Assistant Examiner—Beth E. Owens
(74) Attorney, Agent, or Firm—Jacqeline J. Garner; W. James Brady, III; Frederick J. Telecky, Jr.

(57) ABSTRACT

According to one embodiment of the invention, a method is provided. The method includes lining, with a conductive liner, a surface of a dielectric layer. The surface defines at least two trenches separated by a platform. Each of the defined trenches includes a conductor that overlies the conductive liner and is positioned within the each of the defined trenches. The conductor is electrically coupled to the conductive liner. The method also includes covering the portion of the conductive liner overlying the platform after lining the surface. The method also includes removing any uncovered portions of the conductive liner while leaving in place the portion of the conductive liner that was covered.

20 Claims, 2 Drawing Sheets

U.S. 6,677,188 B1

METHODS FOR FORMING A FUSE IN A SEMICONDUCTOR DEVICE

TECHNICAL FIELD OF THE INVENTION

This invention relates generally to the field of electronic devices and more particularly to an improved method for forming a fuse in a semiconductor device.

BACKGROUND OF THE INVENTION

Certain semiconductor devices, such as dynamic random access memories ("DRAMs") and static random access memories ("SRAMs"), are designed with redundant rows and/or columns of memory cells. If a memory cell of a row/cell is found to be defective during a test, then the defective memory cell is disconnected by blowing a conductive fuse of the row or column containing the defective cell. Having the redundant rows and/or columns allows a designer to disconnect a defective memory cell without reducing the number of rows/columns below the required number. Typically, a conducting fuse is made of a polysilicon or metal film formed on a dielectric layer. A laser is used to ablate the fuse material and any protective dielectric layer that is covering the fuse material.

Traditionally, the formation of fuses in semiconductor structures, including a damascene structure, requires depositing, patterning, and etching a polysilicon or metal layer. Blowing the fuses formed from performing such steps may increase contamination because particles of the blown fuse and the protective dielectric material may be scattered to other columns/rows. Further, for the case of a damascene structure, empty trenches may result from removal of the fuse material, which may create difficult topology for any subsequent dielectric deposition and may lead to reliability problems.

SUMMARY OF THE INVENTION

According to one embodiment of the invention, a method is provided. The method includes lining, with a conductive liner, a surface of a dielectric layer. The surface defines at least two trenches separated by a platform. Each of the defined trenches includes a conductor that overlies the conductive liner and is positioned within the each of the defined trenches. The conductor is electrically coupled to the conductive liner. The method also includes covering the portion of the conductive liner overlying the platform after lining the surface. The method also includes removing any uncovered portions of the conductive liner while leaving in place the portion of the conductive liner that was covered.

Some embodiments of the invention provide numerous technical advantages. Some embodiments may benefit from some, none, or all of these advantages. For example, according to one embodiment, the fabrication of semiconductor devices requiring fuses is simplified by avoiding extra deposition steps and instead forming the fuses using an existing liner or barrier of the semiconductor structure. According to another embodiment, the blowing of the fuse is facilitated because the material used to form the fuse is relatively thin. According to another embodiment, having a thin fuse allows the blowing of the fuse using electrical current as well as laser exposure, which reduces the level of contamination, improves reliability and greatly simplifies electrical programming at test. According to another embodiment, the coverage requirement for any protective dielectric layer is reduced because of the amount of topology, such as trenches, that results from blowing fuses using laser exposure is reduced.

Other technical advantages may be readily ascertained by one of skill in the art.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS OF THE INVENTION

Embodiments of the invention are best understood by referring to FIGS. 1A through 3 of the drawings, like numerals being used for like and corresponding parts of the various drawings.

Figure 1A:
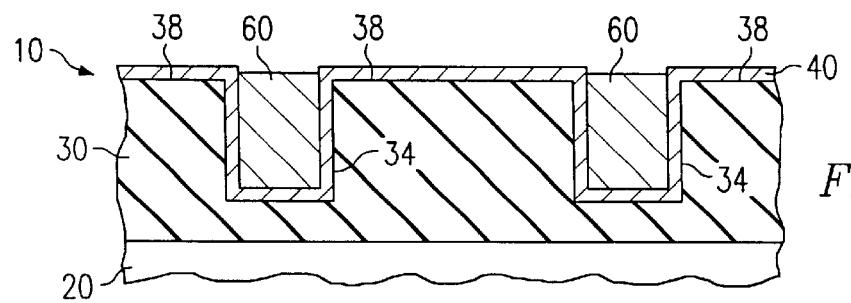
FIGS. 1A through 1D are a series of schematic cross-sectional diagrams illustrating one embodiment of a semiconductor device constructed according to the teachings of the present invention.

FIG. 1A is a schematic cross-sectional diagram illustrating one embodiment of a semiconductor device 10 that may benefit from the teachings of the present invention. Device 10 includes a substrate 20 and a dielectric layer 30 that overlies substrate 20. The surface of dielectric layer 30 defines a plurality of trenches 34 that are separated by a platform 38. Trenches 34 may also be referred to as grooves or holes. Although FIG. 1A shows only two trenches 34, device 10 may have more than two trenches 34 where each trench 34 is separated from a neighboring trench 34 by a particular platform 38. Also, the surface of dielectric layer 30 may define more than one platform 38. Device 10 also comprises a conductive layer 40 that lines the surface of dielectric layer 30. "Lining" refers to providing a layer that directly overlies the surface and the elements that are defined by the surface. Each defined trench 34 that is lined with a portion of conductive liner 40 includes a conductor 60. In one embodiment, each lined trench 34 is filled with a conductor 60, where conductor 60 overlies the portion of conductive liner 40 that lines the lined trench 34 and is positioned within the lined trench 34.

One example of device 10 described at FIG. 1A is referred to as a damascene structure. The term "damascene structure" will be used hereinafter as an example to refer to device 10 shown in FIG. 1A. However, any semiconductor device having a liner or a barrier between its active regions, such as conductors 60, and its dielectric layer, such as dielectric layer 30, may be device 10.

Dielectric layer 30 may be any suitable electrical insulator. For example, dielectric layer 30 may be formed from a layer of oxide. Conductive liner 40 may be formed from any suitable conductive material, such as tantalum, tungsten, ruthenium, cobalt, TaN, WN, CoWP, or a suitable combination of such materials. Conductor 60 may be formed from any suitable conductive material, such as copper or aluminum. In one embodiment, the materials for forming conductor 60 and conductive liner 40 may be chosen so that the material for liner 40 has a lower conductivity than that of the material for conductors 60. For example, although tantalum is a conductive material, it has a lower conductivity than copper. In one embodiment, tantalum may be used to form liner 40 and copper may be used to form conductor 60 so that liner 40 has a lower conductivity than conductor 60.

A damascene structure, such as damascene structure 10, may be fabricated as follows: Trenches 34 are patterned and etched into dielectric layer 30. Then liner 40 is deposited onto the surface of dielectric layer 30 to line the surface using any suitable process, such as physical vapor deposition ("PVD") or chemical vapor deposition ("CVD"). PVD liners are typically around 20–100 nanometers thick on a surface pedestal, such as platforms 38, but may be thinner (approximately 5–25 nm) along the wall of trenches 34 due to non-conformal deposition. CVD liners are typically conformal; thus, a liner having a relatively uniform thickness of approximately 10–20 nanometers may be on both platforms 38 and walls of trenches 34. However, CVD liners may be thinner than 5 nanometers.

A diffusion barrier, such as liner 40, may be necessary where the material that is used to fill trenches 34 has a tendency to diffuse into dielectric layer 30. One such material is copper. After liner 40 is used to line the surface of dielectric layer 30 as a barrier against copper diffusion, a thin copper seed layer (not explicitly shown) is deposited and copper is electroplated onto the cooper seed overlying liner 40 so that lined trenches 34 may be filled with copper to form copper conductors 60. Copper is used herein as an example material for forming conductors 60 that has a tendency to diffuse into dielectric layer 30; however, other conductive material that may benefit from having a barrier or adhesion layer may also be used. In some embodiments, the copper seed layer may be omitted and copper electroplating is performed directly onto liner 40. The electroplating of copper generally overflows trenches 34 and deposits the copper onto the entire surface of liner 40, including the portions that overlie platforms 38. The deposition of material for liner 40, such as tantalum, also deposits excess tantalum onto platforms 38.

The excess copper and tantalum may be removed using any suitable process, such as polishing back the excess material using a chemical-mechanical polishing tool ("CMP") or an electropolish. The process of polishing back includes a first slurry to remove the excess copper so that copper is removed from the top of platform 38 and conductors 60 without eroding conductor 60 in trench 34. A second slurry is used to remove the excess liner that lines platforms 38. The portions of liner 40 that overlie platforms 38 are conventionally removed so that conductors 60 are not electrically coupled to each other by conductive liner 40.

Conventionally, fuses are formed after removing the excess materials that overlie platforms 38. The formation of fuses requires separate processing steps. For example, after conductors 60 of damascene structure 10 are formed, separate deposition and patterning steps are required to form fuses. A dielectric barrier, such as SiN or SiC, is deposited on structure 10 and bond pad openings are patterned and etched to allow electrical probing. After defective bits (memory cells) are identified by the electrical probe, a laser is used to ablate the dielectric barrier over selected fuses. Conductor 60 and liner 40 are then removed by wet etch, and another dielectric barrier is deposited to seal the breached fuse region of structure 10.

According to some embodiments of the present invention, methods are provided for forming fuses by patterning and etching an existing conductive liner instead of using a separately added layer of material. This is advantageous because, according to one embodiment, the fabrication of semiconductor devices requiring fuses is simplified by avoiding extra manufacturing steps. According to another embodiment, the blowing of the fuse is facilitated because the material used to form the fuse is relatively thin. According to another embodiment, having a thin fuse allows the removal of the fuse using electrical current as well as laser exposure, which improves reliability and greatly simplifies electrical programming at test. According to another embodiment, contamination of the semiconductor structure associated with the blowing of the fuses is reduced. In another embodiment, the coverage requirement for any protective dielectric layer is reduced because of the amount of topology, such as trenches, that results from blowing fuses using laser exposure is reduced. Additional details of example embodiments of the methods are described in greater detail below in conjunction with portions of FIG. 1A and FIGS. 1B through 3.

Figure 1B:
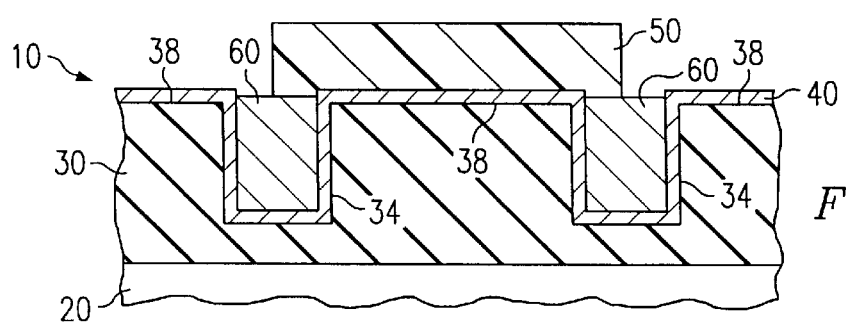

Damascene structure 10 of FIG. 1A shows liner 40 that is left in place by omitting the step of removing portions of liner 40 that overlie platforms 38. In other embodiments, more than one liner 40 having various levels of conductivity may overlie dielectric layer 30. Referring to FIG. 1B, a mask 50 is used to protect portions of liner 40 that may serve as fuses for conductors 60. For example, a portion of liner 40 that overlies platform 38 is protected by mask 50 that covers lined platform 38. Although FIG. 1B shows one lined platform 38 that is positioned between two conductors 60, more than two conductors 60 may be defined by dielectric layer 30 that are separated by other platforms 38. Some, none, or all of these other platforms 38 may be protected by different portions of mask 50, depending on where fuses are needed. Mask 50 may be formed from any suitable material for protecting liner 38, such as photoresist. In one embodiment, as shown in FIG. 1B, the length of mask 50 exceeds the length of lined platform 38 so that portions of conductors 60 that are separated by lined platform 38 are also covered. Having a slightly excessive coverage of lined platform 38 may be desirable where a less precise etching process, such as wet etching, is used.

Figure 1C:
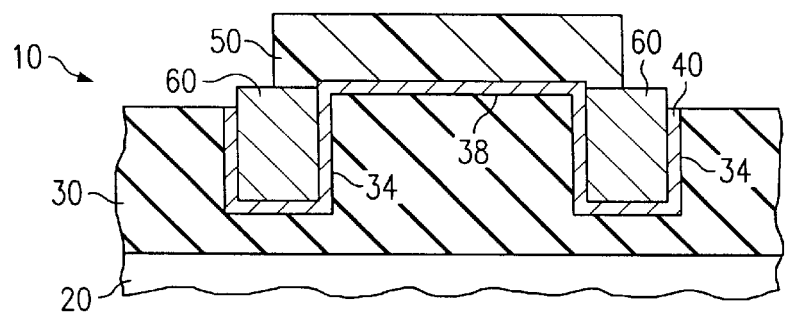
Figure 1D:
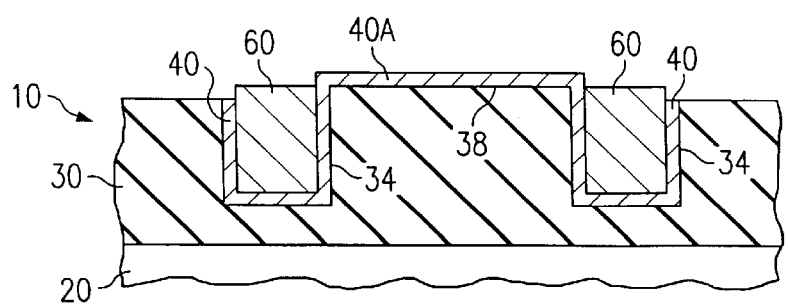
Figure 2:
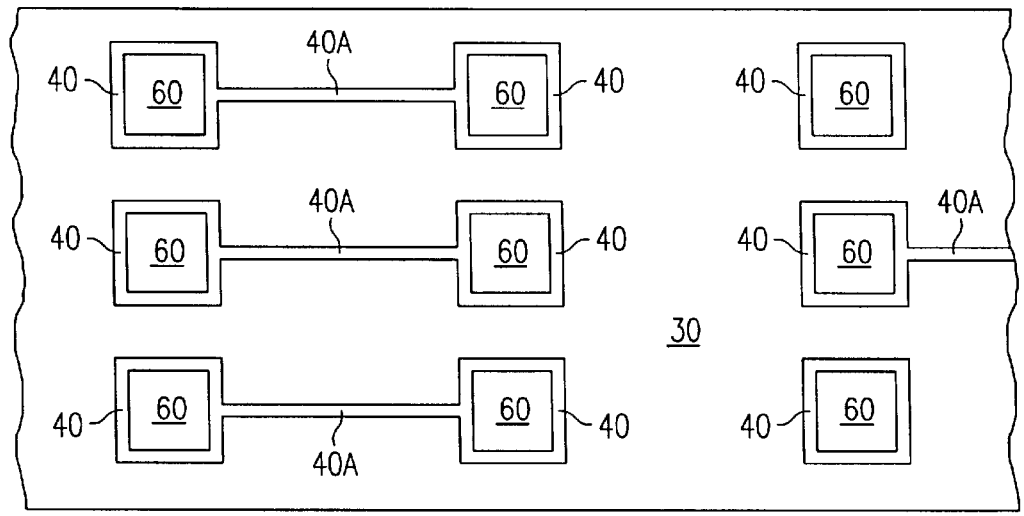
FIG. 2 is a schematic top view diagram illustrating one embodiment of a semiconductor device constructed according to the teachings of the present invention.

Referring to FIG. 1C, the portions of liner 40 that were not protected by mask 50 are etched away using any suitable processes, such as wet etching or dry/plasma etching. Referring to FIG. 1D, mask 50 is removed from lined platform 38. The removal of mask 50 exposes the portion of liner 40 that was protected. The protected portion of liner 40 may now serve as a fuse 40a. Referring to FIG. 2, which is a schematic top view of a plurality of fuses 40a, formed fuses 40a electrically couple their respective conductors 60 through remaining portions of liner 40 that overlie trenches 34.

Figure 3:
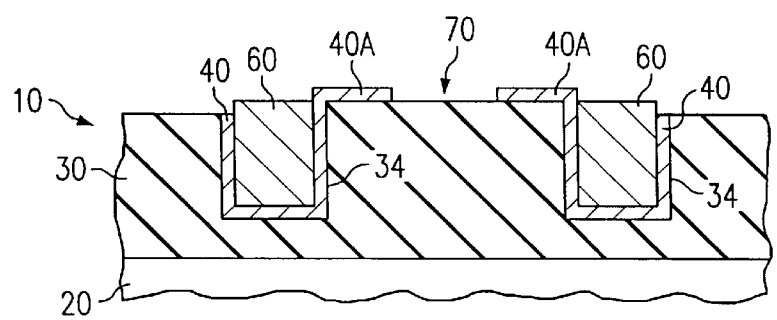
FIG. 3 is a schematic cross-sectional diagram illustrating one embodiment of a semiconductor device constructed according to the teachings of the present invention, wherein a fuse is blown.

Referring to FIG. 3, after forming fuse 40a, fuse 40a may be configured to electrically uncouple conductors 60. The electrical uncoupling may be accomplished by blowing a portion of fuse 40a so that fuse 40a is inoperable to carry electrical current between conductors 60. "Blowing" a fuse refers to destroying a portion or all of fuse 40a by disturbing the integrity of fuse 40a in any manner so that fuse 40a is no longer operable to carry electrical current. For example, fuse 40a may be blown by burning off, removing, severing, ablating, etching, or sputtering any part of fuse 40a. The uncoupling of fuse 40a may be accomplished by blowing fuse 40a using any suitable method. In some embodiments where fuse 40a is relatively thin, a surge of electrical current may be used to create a space 70 in fuse 40a, thereby blowing fuse 40a. This is advantageous because a manufacturer may blow fuse 40a during final test of a memory, such as an SRAM, and avoid the initial electrical probe that is needed for laser trim of fuses. In another example, a laser beam may burn off a portion of fuse 40*a* to create space 70 that electrically decouples conductors 60. Because fuse 40*a* is positioned on platform 38, which, in some embodiments, is the planar surface of device 10, blowing fuse 40*a* does not generate additional topology, such as trenches, that may need to be covered by an additional layer of dielectric material to keep out contaminants. In some embodiments where fuse 40*a* is relatively thin, the level of particle contamination caused by blowing fuse 40*a* is reduced.

Although the present invention has been described in detail, it should be understood that various changes, substitutions, and alterations can be made hereto without departing from the spirit and scope of the invention as defined by the appended claims.

What is claimed is:

1. A method comprising:

lining, with a conductive liner, a surface of a dielectric layer, the surface defining at least two trenches separated by a platform, each of the defined trenches including a conductor that overlies the conductive liner and is positioned within the each of the defined trenches, the conductor electrically coupled to the conductive liner;

after lining the surface, covering the portion of the conductive liner overlying the platform; and removing any uncovered portions of the conductive liner while leaving in place the portion of the conductive liner that was covered.

2. The method of claim 1, wherein lining the surface of the dielectric layer with the conductive liner comprises:

depositing the conductive liner over the surface;

depositing a material over the conductive liner, the material used to form the conductor; and removing a portion of the material that overlies the platform.

3. The method of claim 1, further comprising forming the conductive liner from tantalum.

4. The method of claim 1, wherein the conductors are formed from copper.

5. The method of claim 1, wherein lining the surface of the dielectric layer comprises depositing, on the surface of the dielectric layer, the conductive liner so that the thickness of the conductive liner is less than 100 nanometers.

6. The method of claim 1, wherein covering the portion of the conductive liner comprises providing, on the portion of the conductive liner, a mask formed from photoresist.

7. The method of claim 1, wherein covering the portion of the conductive liner comprises providing, on the portion of the conductive liner, a cover, and further comprising removing the cover from the portion of the conductive liner.

8. The method of claim 1, further comprising blowing the portion of the conductive liner that was covered so that the portion of the conductive liner that was covered is not operable to carry electric current.

9. The method of claim 1, further comprising:

determining that a defect exists in a semiconductor device in which the conductive liner is disposed; and blowing the portion of the conductive liner that was covered so that the portion of the conductive liner that was covered is not operable to carry electric current.

10. A method comprising:

lining, with a conductive liner, a surface of a dielectric layer, the surface defining a first trench, a second trench, and a third trench, the first and the second trenches separated by a first platform, the second and the third trenches separated by a second platform, each of the first, second, and third trenches including a conductor that overlies the conductive liner and is positioned within the each of the first, second, and third trenches, the conductor electrically coupled to the conductive liner;

after lining the surface, covering the portion of the conductive liner overlying the first platform; and removing the uncovered portion of the conductive liner overlying the second platform while leaving in place the covered portion of the conductive liner overlying the first platform.

11. The method of claim 10, wherein the conductor is conductive, and further comprising providing the conductive liner having a lower level of conductivity than the conductivity of the conductor.

12. The method of claim 10, further comprising forming the conductive liner from tantalum.

13. The method of claim 10, wherein the conductors are formed from copper.

14. The method of claim 10, wherein lining the surface of the dielectric layer comprises depositing, on the surface of the dielectric layer, the conductive liner so that the thickness of the conductive liner is less than 100 nanometers.

15. The method of claim 10, wherein covering the portion of the conductive liner comprises providing a mask overlying the first platform, the mask formed from photoresist.

16. The method of claim 10, wherein covering the portion of the conductive liner comprises masking, with a mask, the portion of the conductive liner, and further comprising removing the mask from the portion of the conductive liner.

17. The method of claim 10, further comprising blowing the portion of the conductive liner that was covered so that the portion of the conductive liner that was covered is not operable to carry electric current.

18. The method of claim 10, further comprising:

determining that a defect exists in a semiconductor device in which the conductive liner is disposed; and blowing the portion of the conductive liner that was covered so that the portion of the conductive liner that was covered is not operable to carry electric current.

19. A method for forming a fuse for a semiconductor device, comprising:

providing a dielectric layer having a surface that defines at least two trenches separated by a particular one of a plurality of platforms;

lining, with a conductive liner, the surface of the dielectric layer;

depositing a conductive material on the conductive liner, the conductive material filling the trenches;

removing the conductive material from the plurality of platforms;

after removing the conductive material, covering the portion of the conductive liner overlying the particular one of the plurality of platforms; and forming a fuse with the portion of the conductive liner that was covered by removing any uncovered portions of the conductive liner while leaving in place the portion of the conductive liner that was covered.

20. The method of claim 19, further comprising blowing the fuse.

* * * * *